United States Patent
Vega et al.

(10) Patent No.: US 10,103,226 B2
(45) Date of Patent: Oct. 16, 2018

(54) METHOD OF FABRICATING TUNNEL TRANSISTORS WITH ABRUPT JUNCTIONS

(75) Inventors: Reinaldo A. Vega, Wappingers Falls, NY (US); Emre Alptekin, Wappingers Falls, NY (US); Hung H. Tran, Hopewell Juncton, NY (US); Xiaobin Yuan, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/459,278

(22) Filed: Apr. 30, 2012

(65) Prior Publication Data

US 2013/0285138 A1    Oct. 31, 2013

(51) Int. Cl.
| | |
|---|---|
| H01L 21/336 | (2006.01) |
| H01L 29/06 | (2006.01) |
| H01L 29/66 | (2006.01) |
| H01L 29/739 | (2006.01) |
| H01L 29/78 | (2006.01) |
| H01L 21/28 | (2006.01) |

(52) U.S. Cl.
CPC .... *H01L 29/0684* (2013.01); *H01L 21/28114* (2013.01); *H01L 29/66356* (2013.01); *H01L 29/7391* (2013.01); *H01L 29/78* (2013.01); H01L 21/28079 (2013.01); H01L 21/28088 (2013.01); H01L 21/28194 (2013.01)

(58) Field of Classification Search
CPC ......... H01L 29/66356; H01L 29/66545; H01L 29/66606; H01L 29/66871; H01L 29/7391
USPC ........................................... 257/330; 438/299
See application file for complete search history.

(56) References Cited

U.S. PATENT DOCUMENTS 5,021,841 A  *  6/1991  Leburton ............... H01L 29/772
                                                   257/256
5,336,904 A      8/1994  Kusunoki
(Continued)

FOREIGN PATENT DOCUMENTS

| CN | 104272444 A | 1/2015 |
|---|---|---|
| DE | 2010000354 | 8/2010 |

(Continued)

OTHER PUBLICATIONS

Kim et al., "Germanium-Source Tunnel Field Effect Transistors with Record High Ion/Ioff", Symposium on VLSI Technology Digest of Technical Papers (2009) pp. 178-179.*

(Continued)

*Primary Examiner* — Jay C Kim
(74) *Attorney, Agent, or Firm* — Jared L. Montanaro

(57) ABSTRACT

A method of manufacturing a tunnel field effect transistor (TFET) includes forming on a substrate covered by an epitaxially grown source material a dummy gate stack surrounded by sidewall spacers; forming doped source and drain regions followed by forming an inter-layer dielectric surrounding the sidewall spacers; removing the dummy gate stack, etching a self-aligned cavity; epitaxially growing a thin channel region within the self-aligned etch cavity; conformally depositing gate dielectric and metal gate materials within the self-aligned etch cavity; and planarizing the top surface of the replacement metal gate stack to remove the residues of the gate dielectric and metal gate materials.

8 Claims, 8 Drawing Sheets

(56) References Cited

U.S. PATENT DOCUMENTS

| | | | |
|---|---|---|---|
| 5,371,024 A * | 12/1994 | Hieda | H01L 29/1037 257/E21.429 |
| 5,485,017 A * | 1/1996 | Nishizawa | H01L 29/66196 257/104 |
| 5,576,227 A * | 11/1996 | Hsu | H01L 21/26586 148/DIG. 105 |
| 6,353,251 B1 | 3/2002 | Kimura | |
| 6,479,866 B1 * | 11/2002 | Xiang | H01L 21/76264 257/192 |
| 6,534,367 B2 | 3/2003 | Peake et al. | |
| 6,566,734 B2 * | 5/2003 | Sugihara | H01L 29/1045 257/316 |
| 6,943,087 B1 * | 9/2005 | Xiang | H01L 21/823807 438/149 |
| 6,967,363 B1 * | 11/2005 | Buller | H01L 27/0629 257/288 |
| 7,166,897 B2 * | 1/2007 | Orlowski | H01L 29/0847 257/396 |
| 7,446,372 B2 | 11/2008 | Forbes | |
| 7,682,887 B2 * | 3/2010 | Dokumaci | H01L 21/26506 257/E29.27 |
| 7,777,282 B2 * | 8/2010 | Majhi | H01L 21/2652 257/401 |
| 7,812,370 B2 * | 10/2010 | Bhuwalka | H01L 29/66356 257/192 |
| 7,834,345 B2 * | 11/2010 | Bhuwalka | H01L 21/26586 257/28 |
| 7,897,469 B2 * | 3/2011 | Surdeanu | H01L 29/66356 257/E21.409 |
| 7,947,557 B2 * | 5/2011 | Chen | H01L 29/165 257/192 |
| 7,964,487 B2 * | 6/2011 | Cheng | H01L 21/823807 257/E21.444 |
| 7,964,907 B2 | 6/2011 | Choi et al. | |
| 8,178,400 B2 * | 5/2012 | Chang | H01L 29/66356 257/E21.027 |
| 8,217,470 B2 * | 7/2012 | Chen | H01L 29/1054 257/402 |
| 8,227,841 B2 * | 7/2012 | Curatola | H01L 29/66356 257/288 |
| 8,318,568 B2 * | 11/2012 | Doris | H01L 21/26586 257/E21.4 |
| 8,373,227 B2 * | 2/2013 | Sonsky | H01L 29/0653 257/335 |
| 8,405,121 B2 | 3/2013 | Gossner et al. | |
| 8,466,505 B2 | 6/2013 | Lai et al. | |
| 8,587,075 B2 * | 11/2013 | Bhuwalka | H01L 29/66356 257/402 |
| 8,652,916 B2 * | 2/2014 | Booth, Jr. | H01L 21/26586 257/260 |
| 8,658,507 B2 * | 2/2014 | Zhu et al. | 514/44 R |
| 8,722,498 B2 * | 5/2014 | Scheiper | H01L 21/823412 257/368 |
| 8,750,037 B2 * | 6/2014 | Toh | G11C 16/0408 257/314 |
| 8,791,502 B2 * | 7/2014 | Wang | H01L 29/66477 257/192 |
| 8,809,939 B2 * | 8/2014 | Tanabe | H01L 29/1054 257/327 |
| 9,041,104 B2 * | 5/2015 | Sugizaki et al. | 257/345 |
| 2002/0022324 A1 | 2/2002 | Hueting et al. | |
| 2004/0089890 A1 * | 5/2004 | Burnett | H01L 21/26586 257/296 |
| 2006/0091490 A1 * | 5/2006 | Chen | H01L 29/7391 257/458 |
| 2006/0125041 A1 * | 6/2006 | Yang | H01L 21/26586 257/476 |
| 2006/0202254 A1 * | 9/2006 | Lai | H01L 21/28273 257/315 |
| 2008/0079084 A1 * | 4/2008 | Hanafi | H01L 21/28052 257/369 |
| 2008/0224224 A1 | 9/2008 | Vandenderghe et al. | |
| 2009/0026553 A1 | 1/2009 | Bhuwalka et al. | |
| 2009/0242941 A1 | 10/2009 | Zhu et al. | |
| 2009/0302412 A1 * | 12/2009 | Cheng | H01L 21/823807 257/506 |
| 2010/0200916 A1 * | 8/2010 | Gossner | H01L 29/083 257/335 |
| 2011/0042758 A1 * | 2/2011 | Kikuchi | H01L 29/1054 257/408 |
| 2011/0062501 A1 | 3/2011 | Soss et al. | |
| 2011/0084319 A1 * | 4/2011 | Zhu | B82Y 10/00 257/288 |
| 2011/0089392 A1 | 4/2011 | Nirschl | |
| 2011/0133169 A1 | 6/2011 | Bansaruntip et al. | |
| 2011/0210375 A1 | 9/2011 | Ikeda et al. | |
| 2011/0227170 A1 | 9/2011 | Zhu et al. | |
| 2011/0254080 A1 | 10/2011 | Doris et al. | |
| 2011/0303950 A1 | 12/2011 | Lauer et al. | |
| 2012/0126310 A1 * | 5/2012 | Yin | H01L 21/823412 257/329 |
| 2012/0313154 A1 * | 12/2012 | Huang | H01L 29/7839 257/288 |
| 2013/0285138 A1 | 10/2013 | Vega et al. | |

FOREIGN PATENT DOCUMENTS

| | | | |
|---|---|---|---|
| DE | 2011119497 | | 7/2013 |
| DE | 112013001023 | T5 | 3/2015 |
| GB | 2515930 | A | 11/2013 |
| JP | H04335538 | A | 11/1992 |
| JP | H08186273 | A | 7/1996 |
| JP | H11163339 | A | 6/1999 |
| JP | 2000077658 | A | 3/2000 |
| JP | 2004000018 | A | 1/2004 |
| JP | 2008021970 | A | 1/2008 |
| JP | 2008166396 | A | 7/2008 |
| JP | 2009526390 | A | 7/2009 |
| JP | 2010003916 | A | 1/2010 |
| JP | 2011035126 | A | 2/2011 |
| JP | 2011181617 | A | 9/2011 |
| JP | 2015522942 | A | 8/2015 |
| KR | 20070100028 | | 10/2007 |
| KR | 10-906500 | | 7/2009 |
| KR | 1020110111743 | A | 10/2011 |
| KR | 10-1137259 | | 4/2012 |
| KR | 10-1137259 | B1 | 4/2012 |
| KR | 20150005584 | A | 1/2015 |
| WO | WO 2011/079596 | * | 7/2011 ........... H01L 21/336 |
| WO | WO 2011/106973 | * | 9/2011 ........... H01L 21/336 |
| WO | 2013165630 | A1 | 11/2013 |

OTHER PUBLICATIONS

"Vertical Tunnel Field-Effect Transistor", Bhuwalka, et al., IEEE Transactions on Electron Devices; DOI: 10.1109/TED.2003.821575.

International Search Report/Written Opinion; dated Jul. 23, 2013; US2013/033953.

"Germanium-Source Tunnel Field Effect Transistors With Record High Ion/Ioff", Sung Hwan Kim, et al.; 2009 Symposium on VLSI Technology Digest of Technical Papers; pp. 178 and 179.

"Broken-Gap Tunnel MOSFET: A Constant-Slope Sub-60-mV/decade Transistor", Joshua T. Smith, et al.; IEEE Electron Device Letters, vol. 32, No. 10, Oct. 2011.

"Scaling the Vertica Tunnel FET With Tunnel Bandgap Modulation and Gate Workfunction Engineering", Krishna K. Bhuwalka, et al., IEEE Transactions on Electron Devices, vol. 52, No. 5, May 2005.

"Tunnel Field Effect Transistor With Raised Germanium Source", Sung Hwan Kwan, et al., IEEE Electron Device Letters, vol. 31, No. 10, Oct. 2010.

Bhuwalka et al., "A Simulation Approach to Optimize the Electrical Parameters of a Vertical Tunnel FET", IEEE Transactions on Electron Devices, vol. 52, No. 7, Jul. 2005, pp. 1541-1547.

Register et al., "Stepped Broken-Gap Heterobarrier Tunneling Field-Effect Transistor for Ultralow Power and High Speed", IEEE Electron Device Letters, 2011, pp. 1-3.

(56) References Cited

OTHER PUBLICATIONS

U.S. Appl. No. 14/887,413, titled "Tunnel Transistors With Abrupt Junctions," filed Oct. 20, 2015, pp. 1-23.

* cited by examiner

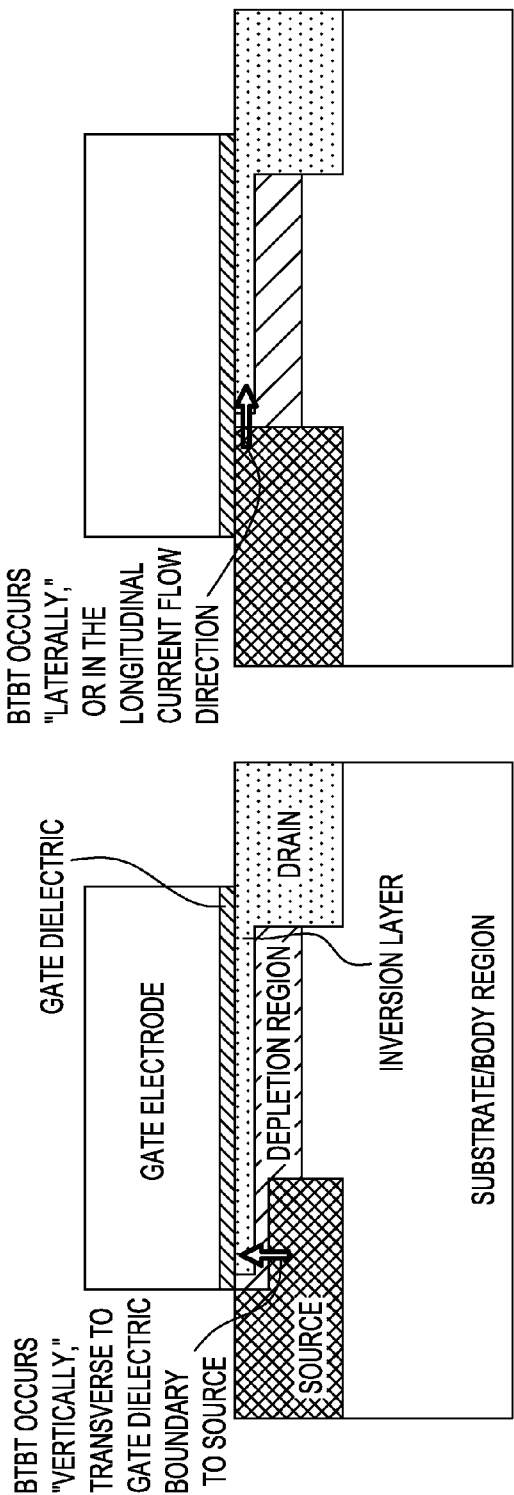
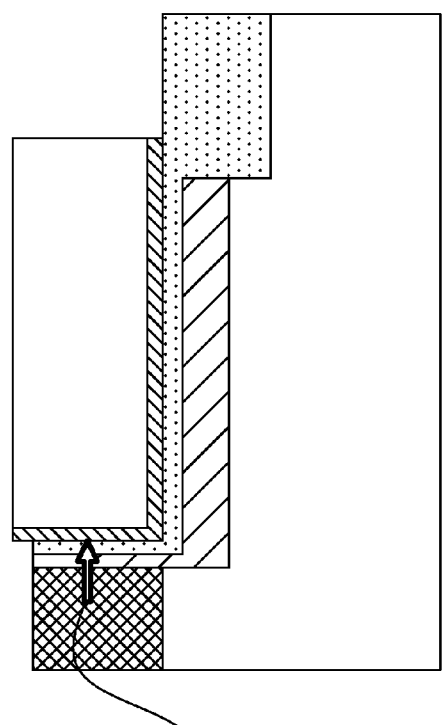
FIG. 1a (PRIOR ART)
FIG. 1b (PRIOR ART)
FIG. 1c (PRIOR ART)

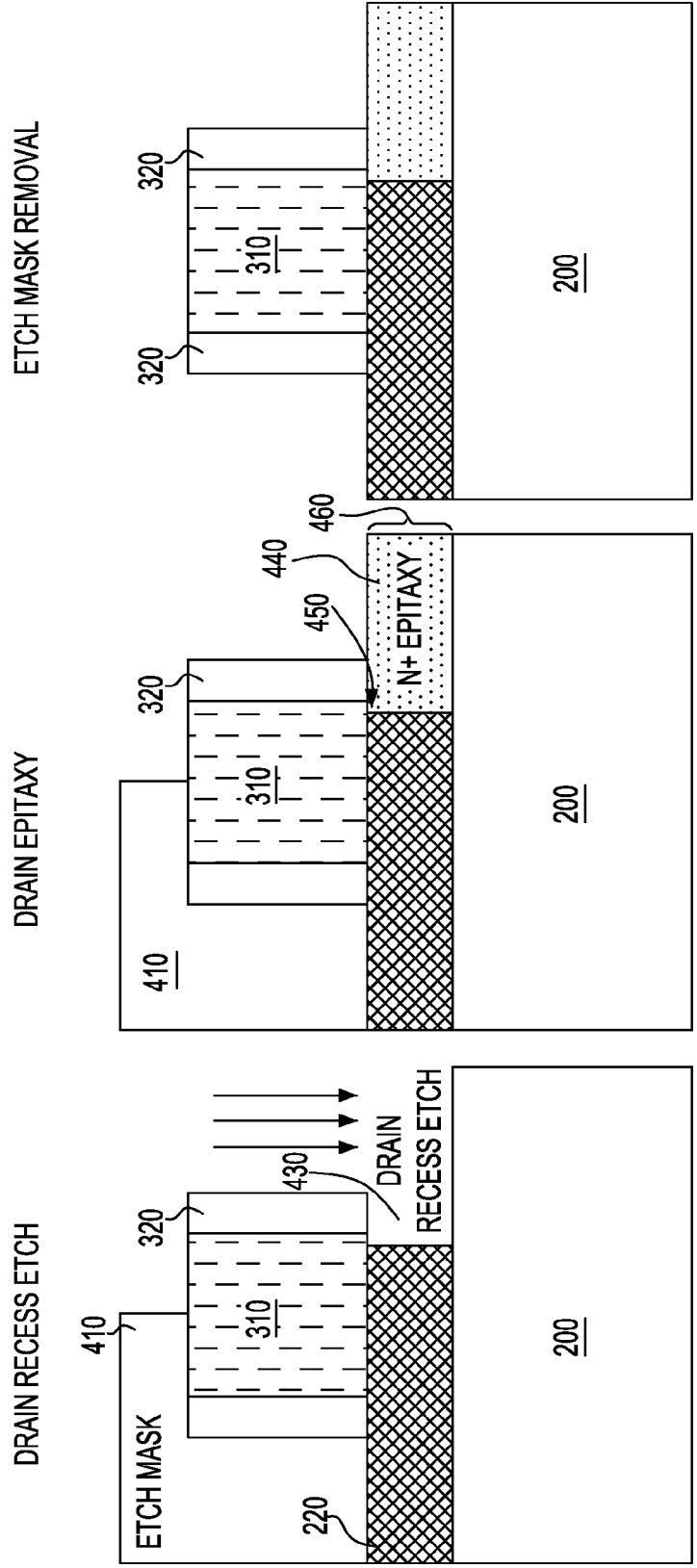

METHOD OF FABRICATING TUNNEL TRANSISTORS WITH ABRUPT JUNCTIONS

FIELD OF THE INVENTION

The present invention relates to semiconductors devices, and more particularly, to junction tunnel transistors (TFETs) with controllable gate overlap and abrupt junctions as part of a replacement gate process flow and a method of manufacturing the same.

BACKGROUND OF THE INVENTION

Tunnel FETs have shown to be an alternative transistor design applicable to very low voltage operations. TFETs are a different type of transistor than conventional, thermal MOSFETs, because in TFETs a tunnel energy barrier is modulated at the source region, as opposed to a thermal barrier at the source region. It is the modulation of this tunnel barrier (in particular, a band-to-band tunnel (BTBT) barrier) which results in a drain-current-to-gate-voltage sensitivity (i.e, sub-threshold swing or SS) which can be superior to that in thermal MOSFETs. In thermal MOSFETs, the thermal limit for SS is defined as $n*k*T*\ln(10)$, where k is Boltzman's constant, T is the temperature (in Kelvin scale), and n is the ideality factor (greater than or equal to 1, but ideally 1). Under ideal conditions at room temperature, the SS limit for thermal MOSFETs is 60 mV/decade, i.e., the minimum change in gate bias needed to increase the drain current by a factor of 10 is 60 mV. Any device that can offer a room temperature SS limit below 60 mV/decade will permit scaling down the transistor threshold voltage (Vt), and therefore the power supply voltage (VDD) without increasing the off-state leakage current. This is desirable from a circuit design standpoint, since VDD scaling reduces dynamic power consumption while keeping the off-state leakage constant results in no increase in standby power consumption.

TFETs of various designs have achieved both in theory and in practice SS values below 60 mV/dec. This is accomplished by leveraging the energetic distribution of tunnel carriers between the conduction and valence band edges. In order to obtain BTBT, the conduction band of one portion of the device must exist at a lower energy than the valence band of another portion. This is referred to as band edge overlap. The extent of this band edge overlap defines the energy range over which carriers can tunnel between the conduction and valence bands in these regions. The energetic distribution of the tunnel carriers plays a major role in determining SS, since the low SS achieved in TFETs is defined by the transition between zero or negative band edge overlap (i.e, zero BTBT) and some finite band edge overlap (i.e, finite BTBT). This can be engineered through the use of different materials (e.g., Si, Ge, III-V) and/or geometries (e.g., 1-D, 2-D, or 3-D density of states).

A conventional Ge source region achieving sub-60 mV/dec SS in a TFET structure has been empirically demonstrated and shown to significantly improve the performance over prior work due to a reduced bandgap of Ge relative to Si or SiGe. The placement of the Ge source under the gate electrode has been shown by performing an isotropic etch to undercut the gate followed by a Ge deposition to fill the etched region. The limitation of the improvement is mainly related to the use of an isotropic etch to undercut the gate electrode. Since it is desirable to place the Ge directly under the gate dielectric, the gate dielectric ends up being exposed to the isotropic etch, exposing to damage the gate dielectric and lead to high gate leakage. Additionally, there is also a challenge of accurately controlling the undercut etch, since the extent of gate overlap of the Ge source region will determine how much BTBT can be modulated. This tends to occur when the design is a "vertical" TFET (also referenced to a transverse TFET) due to most of the BTBT current flowing in a direction that is transverse to the gate electrode over the source region. In such a design, the total BTBT current is linearly proportional to the extent of gate overlap of the source region.

The concept of a broken-gap TFET has been introduced to effectively engineer the materials on both sides of the BTBT barrier such that a band edge offset exists in equilibrium (i.e, without any gate bias-induced band edge offset), known as a type-III junction. In this particular design, the broken gap region exists at a distance sufficiently away from the gate electrode such that it is not under the influence of the gate electrode. The purpose thereof is to create a TFET structure wherein SS is independent of gate bias, unlike the aforementioned illustration wherein SS changes with the gate bias. Engineering the BTBT barrier effectively is not easily achieved in order to obtain that the tunnel probability in the band edge overlap region be effectively 100%. The remainder of the device is preferably a conventional thermal MOSFET, and such that the structure as a whole is basically a source-limited thermal MOSFET, wherein the thermal barrier modulated by the gate electrode controls the portion of the energetic distribution of carriers injected at the source BTBT barrier. This achieves a very steep SS over several decades of current when compared to the performance of similarly-scaled thermal MOSFETs. The limitation of this embodiment is that no integration scheme is forthcoming for actually building the device.

Conventional TFETs with doped regions have been shown to be formed vertically rather than laterally, (horizontally) as known, for instance in typical MOSFETs, with the gate electrode wrapping around the sidewall regions. A delta-doped p+ SiGe layer exists between the p+ Si source and undoped body regions to facilitate a BTBT injection, and therefore improving the performance. An advantage is that the doped regions can be arbitrarily thick or thin and defined precisely by epitaxial growth. The limitation with this device structure is the same as with all other "vertical" transistor designs, wherein the gate-to-source parasitic capacitance is very high, due to the gate electrode and source regions both covering the same, large, area.

The use of a raised Ge source in a TFET structure is known. The operational concept is the same as previously described except that here, employing a raised source offers a few advantages. Firstly, the presence of the bottom gate corner adjacent to the raised source improves the device electrostatics by suppressing drain field penetration into the gate-induced depletion region in the source (wherein BTBT occurs). Secondly, by using a raised source, precludes the need to use of a required isotropic etch, and so the gate-to-source overlap can be more accurately controlled with epitaxy. However, this structure is limited by the described integration scheme, wherein the Ge epitaxy is formed against the dielectric sidewall region. It is well-known that semiconductor epitaxy against a dielectric sidewall (e.g., raised source/drain epitaxy in conventional MOSFETs) results in faceting and reduced epitaxial film quality along the dielectric sidewall. In the context of a TFET, this will lead to a significant degradation in performance due to the presence of crystalline defects in the epitaxial region.

Referring to FIG. 1a, a planar TFET structure is illustrated operating in a "vertical" (also referred to as transverse)

mode. The source and drain regions can be oppositely doped, and the body region doped to the same polarity as the source region. For example, for an n-type TFET, the source and body can be p-type and the drain, n-type. If the source is doped "low" (e.g., 1E19 cm$^{-3}$), and the body is doped "high" (e.g., 1E18 cm$^{-3}$), then the dominant BTBT direction will be vertical, or transverse to the gate dielectric boundary to the source.

Referring to FIG. 1b, if the source is doped heavily (e.g., 1E20 cm$^{-3}$) and the body is doped lightly, (e.g., 1E16 cm$^{-3}$), then the dominant BTBT direction will be "lateral" (also referenced as longitudinal), or in the direction of the current flow in the channel under the gate dielectric. This is caused by the relative doping levels in the source and body regions that determine which BTBT mode turns on first. With high source doping and low body doping, the lateral BTBT threshold voltage (Vt) will be lower, while the vertical BTBT Vt will be higher, leading to a lateral-BTBT dominated mode of operation, and vice versa.

The lateral and vertical terminologies are only accurate for simple, planar structures. However, when the source region becomes elevated, the orientation of BTBT is altered, since now it is the gate sidewall that controls the BTBT current. This is illustrated with reference to FIG. 1c, wherein the tunnel mode is transverse (as in FIG. 1a), but the tunnel direction is lateral (as in FIG. 1b). The tunnel mode being an essential feature of the type of the TFET, the mode of operation is therefore defined as either transverse (i.e., "vertical" in a planar structure) or longitudinal (i.e., "lateral" in a planar structure).

Although TFETs are known in the art, there is a need for a structure provided with an intrinsic epitaxial layer bridging the source, body and drain regions (p-i-n junctions) of the device structure.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the, wherein like reference numerals denote like elements and parts, in which:

FIG. 1a is cross-sectional view illustrating a prior art BTBT occurring "vertically" i.e., transverse to the gate dielectric boundary to the source of the TFET;

FIG. 1b shows a cross-sectional side view illustrating a prior art BTBT occurring "laterally" i.e., in the longitudinal current flow direction;

FIG. 1c shows a cross-sectional side view depicting a prior art BTBT occurring "laterally" but transverse to the gate dielectric;

FIGS. 4a-4c show side cross-sectional views illustrating the drain region etched away and filled with in-situ doped n+ epitaxial material;

SUMMARY

Figure 3:
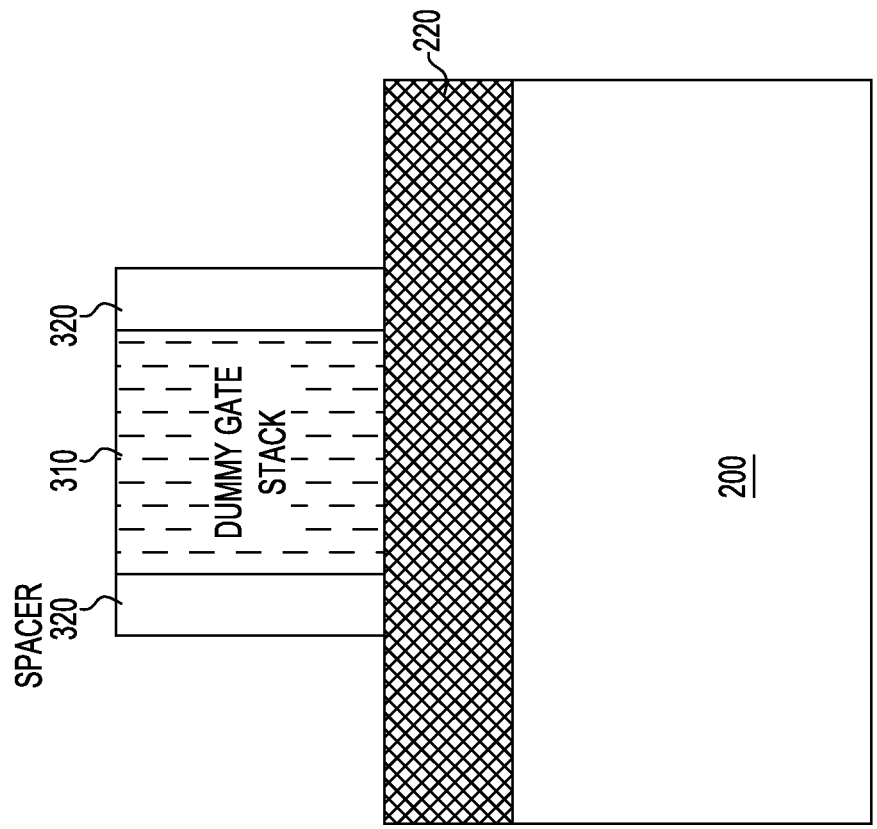
FIG. 3 is a side cross-sectional view showing a dummy gate stack surrounded by a spacer on top of the epitaxial layer.

In one aspect, an embodiment of the invention provides a method of forming a TFET device having a thin epitaxial layer bridging the source, body and drain regions (p-i-n junctions) that provides a thin barrier between the N+ and P+ regions, with the thin epitaxial layer being modulated by the gate.

In another aspect, an embodiment of the invention provides two types of TFET designs, i.e., "vertical" TFETs and "lateral" TFETs, respectively referenced to the more accurate terminology of "transverse" TFETs and "longitudinal" TFETs.

In a further aspect, an embodiment of the invention provides leveraging the replacement gate, or "gate last" process flow forming a self-aligned etch cavity directly under the gate electrode, wherein an epitaxial layer is formed along the source/drain sidewall.

In still another aspect, an embodiment describes tuning the crystal direction in which BTBT takes place by varying the shapes of the self-aligned etch cavity, and wherein in view of different crystal directions having a different effective tunnel mass, the crystal direction can be tuned depending on the materials used in the BTBT region.

In yet a further aspect, in an embodiment, P+ and N+ regions and intrinsic/lightly-doped regions are formed defining the TFET source, body, and drain regions using epitaxy, implant, or any combination thereof, abutting to a structure having the intrinsic/lightly-doped region separating the P+ from the N+ regions.

In still a further aspect, in an embodiment, a MESA etch defines the shape of the TFET channel region, preferably during a replacement gate process, e.g., metal replacement, wherein the dummy gate region determines the length and width of the MESA etch cavity.

In yet a further aspect, a channel region is grown epitaxially over the TFET structure, covering at least the source region (i.e, the P+ region for an N-type TFET, or the N+ region for a P-type TFET). The epitaxial channel region can be doped or undoped.

In another aspect, an embodiment provides a method of manufacturing a TFET that includes forming on a substrate covered by an epitaxial growth of source material a dummy gate stack surrounded by sidewall spacers; forming doped source and drain regions followed by an inter-layer dielectric surrounding the sidewall spacers; removing the dummy gate stack, etching a self-aligned cavity; epitaxially growing a thin channel region within the self-aligned etch cavity; and conformally depositing gate dielectric and metal gate materials within the self-aligned etch cavity.

In still another aspect, an embodiment of the invention provides a tunnel field effect transistor (TFET) that includes a p+ source region for n-type TFET or n+ source region for p-type TFET; an n+ drain region for n-type TFET or p+ drain region for p-type TFET; a body region that is either intrinsic or doped, with a doping concentration less than that of the source region, separating the p+ and n+ source/drain regions; a self-aligned etch cavity separating the p+ and n+ source/drain regions; a thin epitaxial channel region that is grown within the self-aligned etch cavity, covering at least the source region; a replacement gate stack comprising a high-k gate dielectric and one or a combination of metals; and sidewall spacer regions adjacent to the replacement gate stack.

DETAILED DESCRIPTION

Detailed embodiments of the methods and structures of the present disclosure are described herein; however, it is to be understood that the disclosed embodiments are merely illustrative of the described methods and structures that can be embodied in various forms. In addition, each of the examples given in connection with the various embodiments of the disclosure is intended to be illustrative, and not restrictive. Further, the FIGs. are not necessarily to scale, some features can be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "top", "bottom", and derivatives thereof shall relate to the disclosed structures, as they are oriented in the drawing FIGs.

The process described herein illustrates an n-type TFET process flow (i.e, NMOS-like). However, p-type TFETs (i.e, PMOS like) can be formed in the same manner, with the exception of using different bandgap engineered materials for the source, channel, and drain regions.

Figure 2:
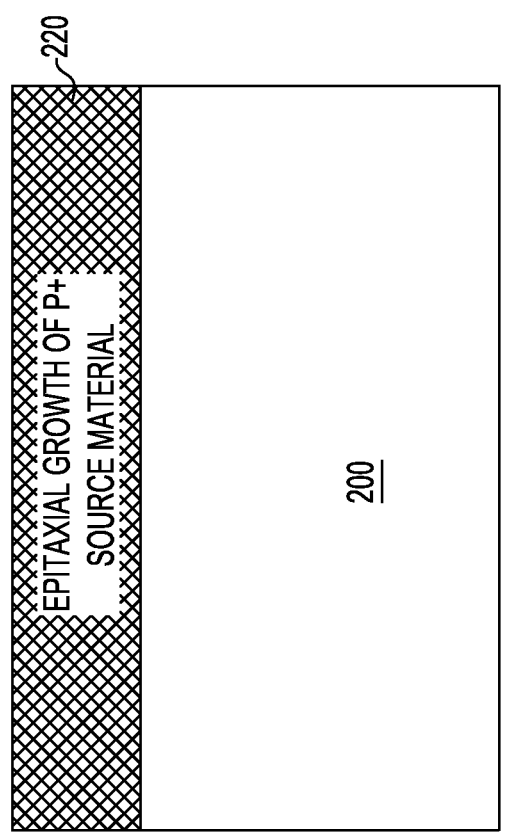
FIG. 2 is a side cross-sectional view depicting a p-type substrate superimposed by an epitaxial growth of p+ source material.

Referring to FIG. 2, a substrate (200) is shown upon which an epitaxial layer (220) is grown that ultimately defines the source material. For an n-type TFET, the preferable source material has a valence band edge offset to the channel material such that the valence band edge energy in the source material is higher than that in the channel, wherein a conduction band edge offsets such that the conduction band edge energy in the channel material is lower than that in the source material. An illustrative material of choice includes silicon germanium (SiGe) or pure germanium. Pure germanium has an electron affinity of 4 eV and a bandgap of 0.66 eV. SiGe has an electron affinity between 4 eV and 4.05 eV and a bandgap between 0.66 eV and 1.12 eV (depending on the Ge content). The thickness of the epitaxial layer ranges from 5 to 20 nm.

Referring to FIG. 3, a dummy gate stack (310) and sidewall spacers (320) are obtained by first growing or depositing a dummy gate dielectric (e.g., silicon dioxide with a preferred thickness of 3 nm, sufficient to act as an etch stop layer or endpoint detection layer when the dummy gate stack is patterned). This is followed by a deposition of the dummy gate material (typically polysilicon, with a thickness of the order of 50 nm). Next, the aforementioned step is followed by the deposition of a capping layer over the dummy gate material (typically silicon nitride, with a thickness on the order of 30 nm). All three layers described thus far are shown for illustrative purposes only as one layer. The dummy gate stack is then patterned by lithography, and subsequently etched in conformity with the lithographically defined pattern. Then, sidewall spacer material (typically silicon nitride, with a thickness on the order of 10 nm) is deposited and anisotropically etched.

Referring to FIGS. 4a-4c, the drain region is formed in one embodiment, using conventional ion implant/anneal processing, or alternatively, the drain region selectively etched away and filled in with in-situ doped n+ epitaxial material. The latter approach is preferred and is shown to avoid excessive thermal processing which can otherwise relax any strain between the epitaxial layers and the underlying substrate (which could lead to crystalline defects). The recess etch shape of the drain region can take any shape by undercutting the drain-side sidewall spacer that protrudes under the dummy gate stack. In view of the self-aligned cavity etching (hereinafter in the process flow), the drain region is exposed, extending from under the dummy gate stack and ending into the source region.

Referring to FIG. 4a, an etch mask (410) (e.g., silicon dioxide) is deposited and patterned such that the source side of the TFET is covered, leaving the drain side (430) of the TFET exposed. Subsequently, a recess etch is performed into the drain side of the TFET. The recess etch is shown in FIG. 4b as having preferably the same depth (440) as the epitaxial source material, but can be any depth greater or equal thereto. To achieve an undercut (450) in the recess etch profile such that the bottom of the dummy gate partially overlaps the recess etch profile, an isotropic reactive ion etch (RIE) or a wet etch or a combined thereof can be performed, using a chlorine-based or fluorine based plasma as reactive species.

Still referring to FIG. 4b, the drain region is preferably epitaxially grown. The thickness of the layer (460) can be greater than or equal to the thickness of the recess etch depth. In an embodiment of an n-type TFET, in-situ doped SiP or SiCP can be used to form the n+ drain region.

Referring to FIG. 4c, the etch mask is removed from the structure. If the etch mask (410) is made of silicon dioxide, the etch mask can be removed selectively using a wet HF etch.

Figure 5:
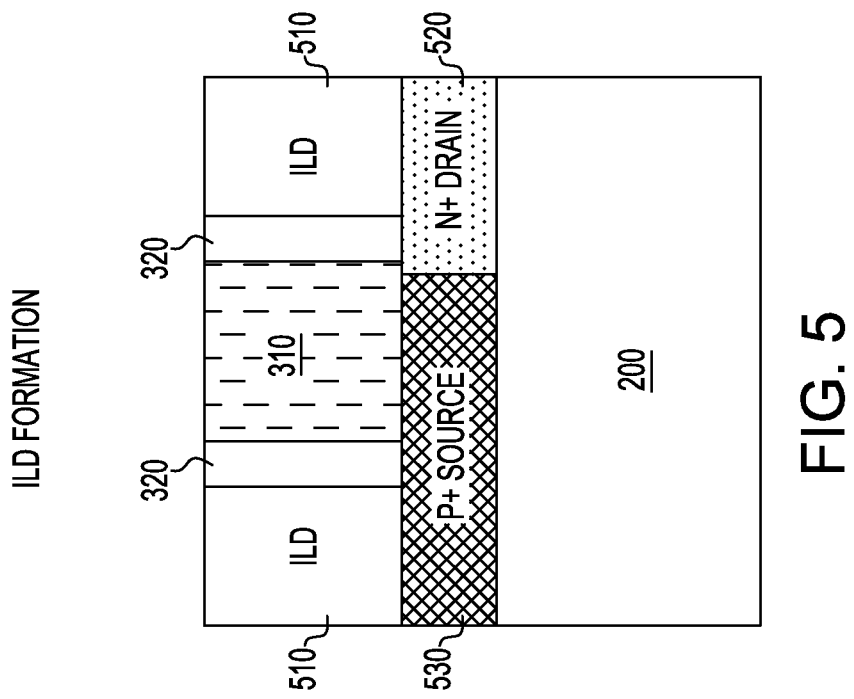
FIG. 5 shows a cross-sectional view depicting an inter-layer dielectric (ILD) deposited and planarized.

Referring now to FIG. 5, an interlayer dielectric (ILD) layer (510) is deposited and planarized. The ILD material preferably used includes silicon dioxide and/or silicon nitride. A chemical mechanical planarization (CMP) is preferably employed to planarize both the ILD and the gate stack, exposing the dummy gate material (polysilicon in this example) within the gate stack. Also shown, are the source region (530) and the drain region (520).

Figure 6A:
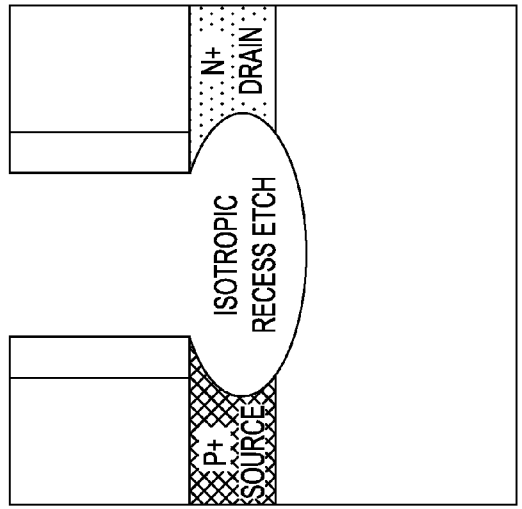
FIGS. 6a-6d depict side cross-sectional views illustrating the removal of the dummy gate stack followed by etching a cavity, and more particularly, showing four examples respectively depicting anisotropic, isotropic, and two sigma-shaped cavities.
Figure 6B:
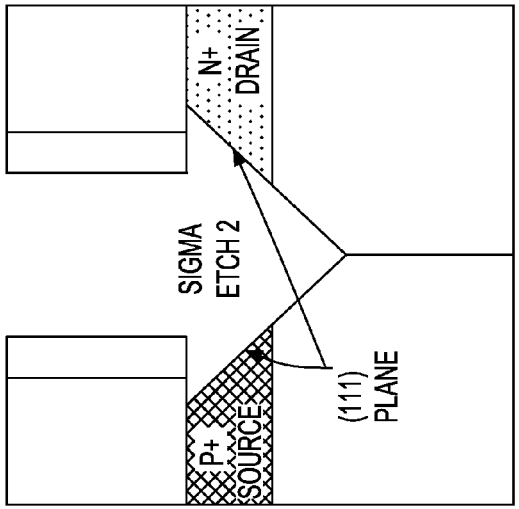
Figure 6C:
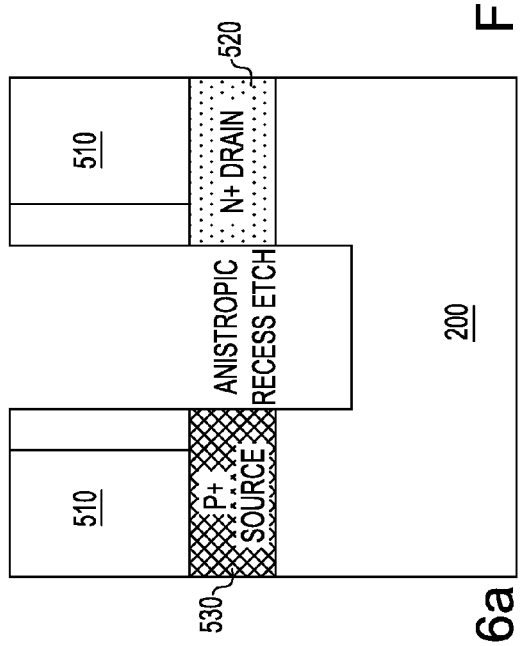
Figure 6D:
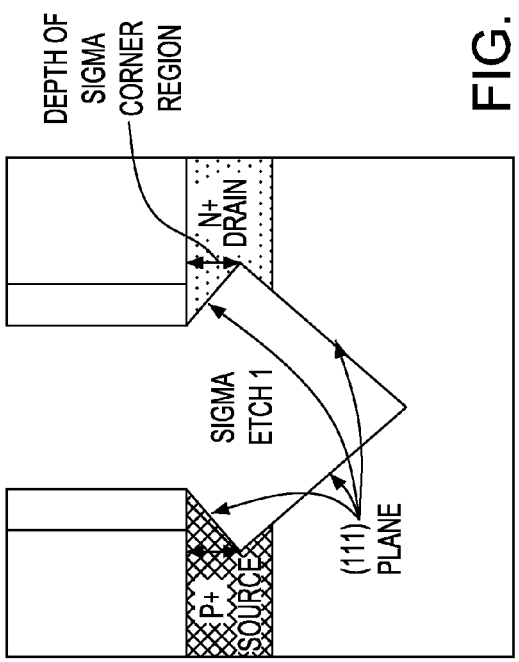

Referring to FIGS. 6a-6d, the dummy gate (310, FIG. 3) is preferably removed by a combination of wet and/or dry etching (e.g., anisotropic RIE selective to polysilicon, followed by an ammonium hydroxide wet etch to remove residual polysilicon), and forming a cavity. Four non-limiting examples are depicted in FIG. 6a, for an anisotropic recess etch, an isotropic recess etch (FIG. 6b), and sigma-shaped (i.e, sigma etch 1 and sigma etch 2) cavities (FIGS. 6c and 6d). Each etch shape results in an etch surface with different exposed crystal planes. Depending on the materials used and the direction of effective mass anisotropy, a different set of crystal planes will be optimal for maximizing BTBT current and therefore TFET drive current. Moreover, corner regions in the anisotropic and sigma recess etches confine the drain voltage drop to take place between the corner regions and the drain terminal. This results in a uniform surface potential along the BTBT perimeter at the source/channel junction caused at the corner regions, the inversion charge is at a lower concentration than in the "planar" regions due to electric field dilution from the inside of the corner region and extending outward toward the channel. This creates regions of higher resistance wherein some or a majority of the drain voltage is dropped, reducing the drain voltage drop across the source region. If this effect does not take place (e.g., for a planar TFET, FIGS. 1a-1c), then there will be a drain-bias-induced potential distribution throughout the source, which leads to a non-uniform transverse electric field distribution within the source. This, in turn, leads to an operational mode wherein some fraction of the BTBT is transverse while the other fraction is longitudinal. Since the transverse and longitudinal modes have a different Vt, the net result is a degradation in SS and therefore drive current at the same off-state leakage. Thus, the anisotropic and sigma etches are preferred for maximizing the TFET performance.

Referring to FIG. 6a, anisotropic etching can be realized by using a HBr (hydrogen bromide) based RIE. The depth of the recess cavity is preferably greater than the thickness of the epitaxial source material, and can be on the order of 50 nm.

Referring to FIG. 6b, a chlorine-based plasma etch can be utilized to form the isotropic etch cavity. Again, the depth of the etch cavity is preferably greater than the thickness of the epitaxial source material.

Referring to FIG. 6c, the sigma shape can be formed by a combination of RIE and wet etching. For example, HBr-based RIE can be performed to create an initial etch cavity, similar to the anisotropic etch cavity in FIG. 6a but with a smaller etch depth. Alternately, a Chlorine or Fluorine based isotropic RIE can be performed to create an initial etch cavity, similar to the isotropic etch cavity (FIG. 6b), but with a smaller etch depth. Either one of these can have an etch depth on the order of 5-10 nm, and followed by a wet etch in ammonium hydroxide to form the final sigma shape shown. The depth of the initial RIE etch profile determines the placement of the sigma corner regions extending under/past the sidewall spacers and into the doped source/drain regions. The sigma corner regions do not need to terminate within the doped source/drain regions, however. The initial RIE can be sufficiently deep that the final sigma profile results in thee corner regions extending below the source/drain regions.

Referring to FIG. 6d, the process of forming the sigma shape is such that the sigma corner regions extending into the source/drain regions do not extend to a depth below the surface. This can be achieved by performing an ammonium hydroxide wet etch, wherein the wet etch undercuts the sidewall spacers to result in some lateral protrusion of the sigma corner regions.

Referring to FIG. 7, channel material is epitaxially grown within the etch cavity, This is an optional, albeit preferred, step and can be used to create a BTBT junction with larger band edge offset within the junction (e.g., a broken gap tunnel junction). It is noteworthy that one could forego the epitaxial growth and proceed straight to the next step (i.e, gate stack formation), such that BTBT takes place purely within the source material and not across a junction between the source and the channel.

Figure 7A:
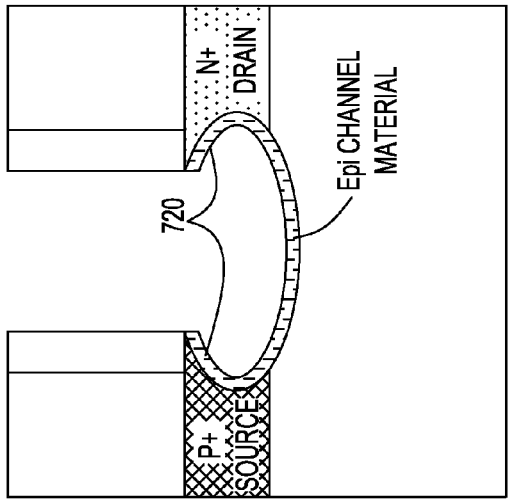
FIGS. 7a-7d are side cross-sectional views of the channel epitaxially grown within the etch cavity.
Figure 7B:
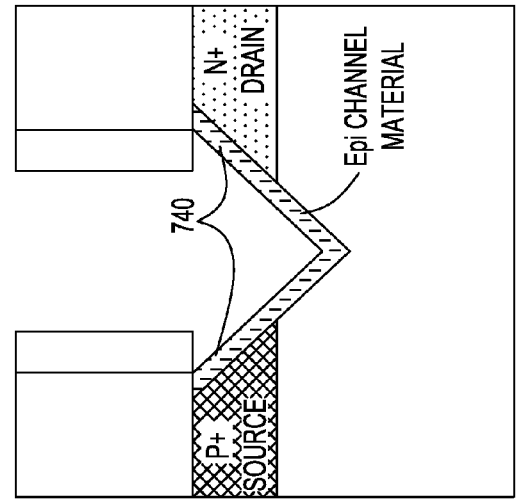

Referring now to FIGS. 7a and 7b, an epitaxial channel material is grown over all the exposed semiconducting regions within the self-aligned etch cavity. The optimal thickness of the material depends on the material used, and the implications for quantum confinement within this material, as well as stress relaxation over the underlying material/s. The epitaxial channels (710,720) thickness can be on the order of 5-10 nm. For illustrative purposes, example of materials include but are not limited to InP, InSb, InAs, and other III-V semiconductors, as well as Ge or graphene.

Figure 7C:
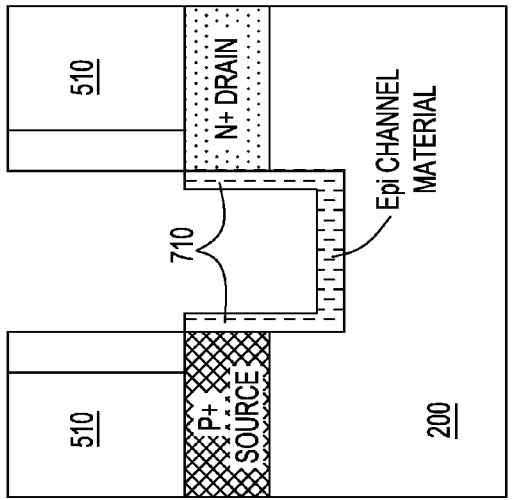
Figure 7D:
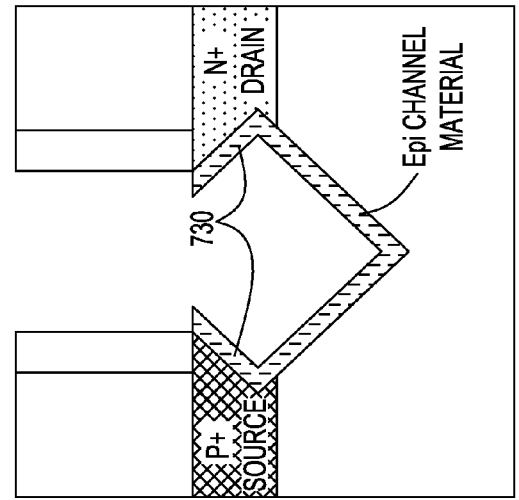

Referring to FIGS. 7c and 7d, the epitaxial channels (730, 740) material is grown over all the exposed semiconductor regions in the self-aligned etch cavity. In the example illustrated herein, the interface between the channel material and the source material exists on a (111) crystal plane.

Still referring to FIG. 7d, since the etch cavity cuts through the source/drain regions and the epitaxial channel is grown 'over' the source/drain regions, the effective channel width is independent of the epitaxial channel thickness (as opposed to a longitudinal mode TFET, wherein the channel thickness plays a role in determining the BTBT cross-sectional area). This implies that relatively thin epitaxial regions can be employed, permitting the usage of materials with a larger lattice mismatch over the source/drain and substrate regions without relaxing the interface strain (that can otherwise occur if the epitaxial layer is too thick). Also, as the thickness of the epitaxial channel layer is reduced, the transverse electric field increases, which leads to higher BTBT current in the on-state (assuming that the material is not so thin that quantum confinement increases the effective tunnel bandgap and reduces the availability of tunnel carriers over the energy range within which BTBT occurs).

Referring to FIGS. 8a-8d, high-k/metal gate stacks are respectively deposited and planarized. The respective high-k materials are initially deposited conformally, covering the entire channel region. Typical choices for high-k dielectrics include $HfO_2$, $Al_3O_2$, and $Ta_2O_5$. The high-k dielectric thickness is preferably on the order of 1-2 nm. To reduce the presence of interface states at the channel-to-high-k interface, the high-k deposition can be preceded by some form of interface passivation using any or a combination of fluorine, oxygen, selenium, sulfur, carbon, hydrogen, and the like, and/or a thin oxide deposition or growth step. After depositing the respective high-k materials, metal gate stacks are then respectively deposited into the self-aligned etch cavity. Each metal gate stack can be formed using any metal needed to meet the gate workfunction and gate leakage specifications required by the source and channel materials to achieve optimal performance. This can include one or a combination of TiN, TaN, TiAl, Ti, Ta, W, Al, Dy, Er, and the like. Following the deposition of the each metal gate stack, CMP is then performed to remove the metal residuals from the top of each structure (i.e, on top of the spacer and ILD regions), resulting in respective electrically isolated metal gate stacks.

Figure 8A:
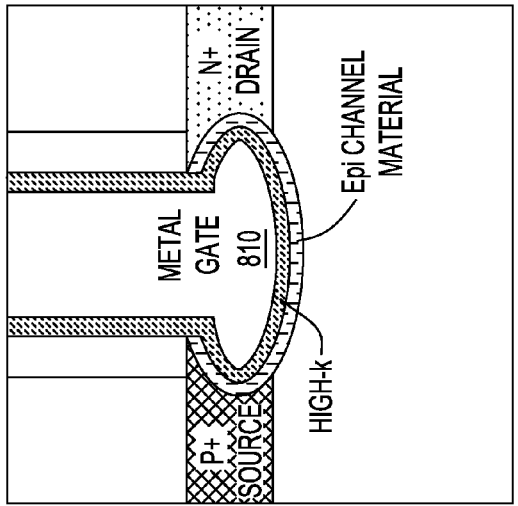
FIGS. 8a-8d show side cross-sectional diagrams of an embodiment showing a final view of the device, wherein in the last step, a high-k/metal gate stack is first deposited and subsequently planarized, wherein the direction of the BTBT current is shown transverse to the gate electrode over the source region.

Referring to FIG. 8a, the direction of BTBT current flow in the on-state from the source to the channel can be in the lateral direction but transverse to the gate electrode. Referring to the thin epitaxial channel layer over the source region described in embodiments of the invention, the gate electrode forms an inversion layer over the source region inducing the BTBT current flow from the source region to the channel region in a direction transverse to the gate electrode.

Figure 8B:
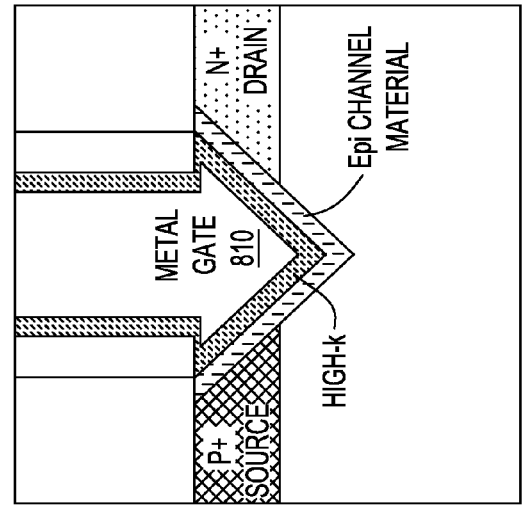

Referring to FIG. 8b, the shape of the interface between the source region and the gate region is curved, indicative that the direction of the BTBT current flow in the on-state is neither lateral nor vertical. However, for each current flow vector (shown by arrows), the flow of the current from the source to the channel region is transverse to the gate electrode. Thus, for both FIGS. 8a and 8b, despite the different absolute directions of the BTBT current flow (i.e., FIG. 8a has a 1-D interface and FIG. 8b has a 2-D curved interface between the source region and gate region), the BTBT current flows nonetheless in a direction transverse to the gate electrode in both cases.

Figure 8C:
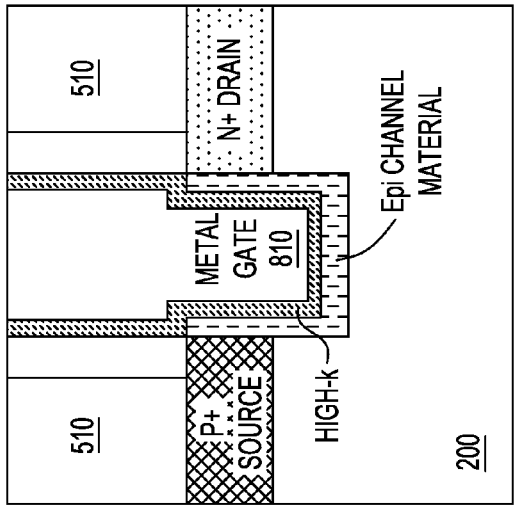
Figure 8D:
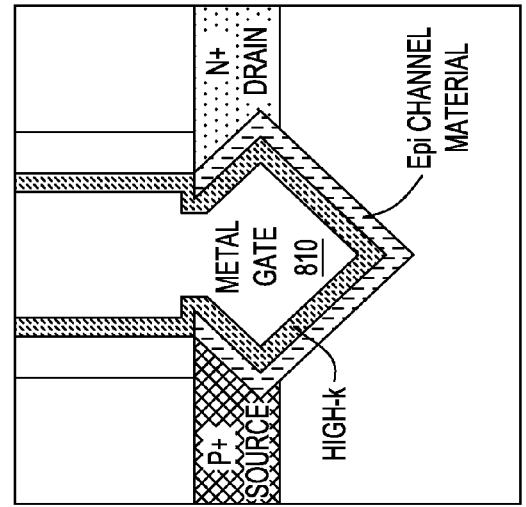
Figure 9A:
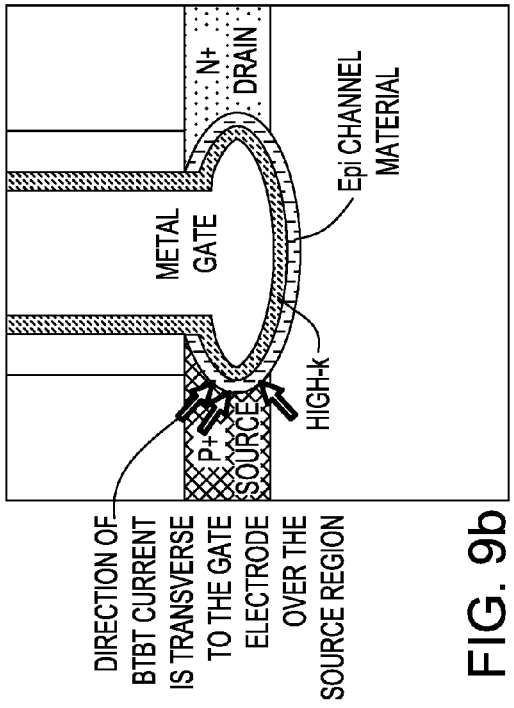
FIGS. 9a-9d illustrate side cross-sectional diagrams of the final views of the device shown in FIGS. 8a-8d that include each current flow vector—shown by arrows from the source to the channel region in a direction transverse to the gate electrode.
Figure 9B:
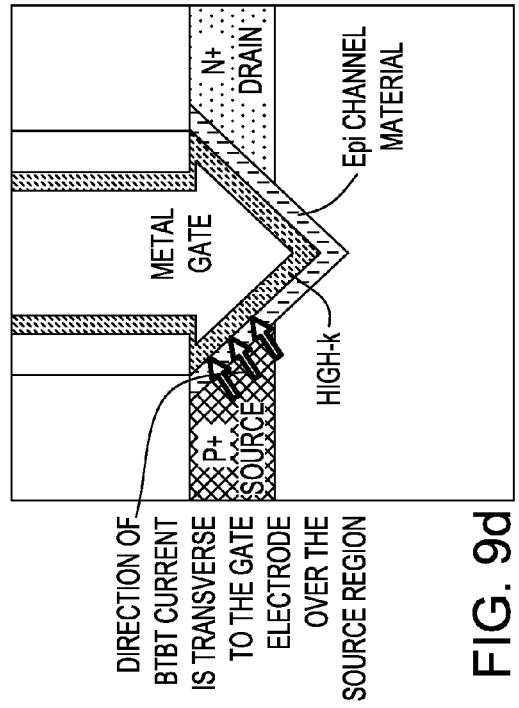
Figure 9C:
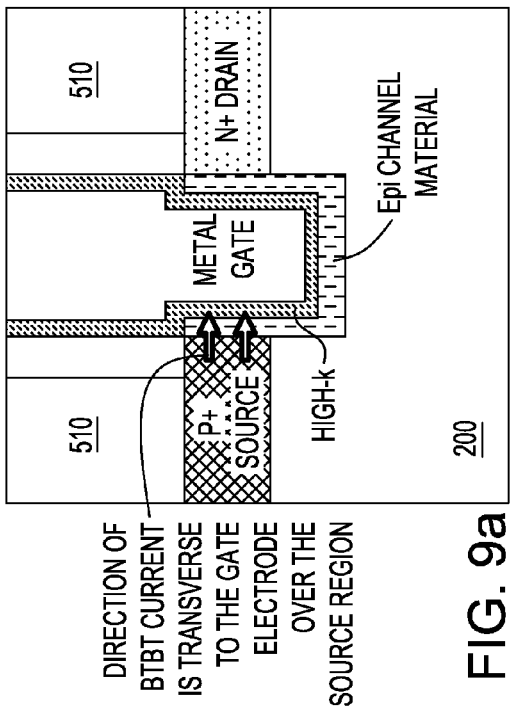
Figure 9D:
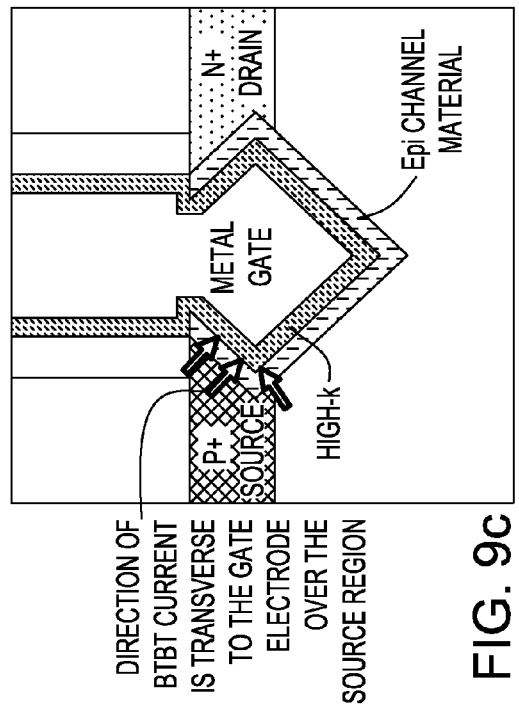

Referring to FIGS. 8c and 8d, the interface between the source region and the gate region exists along the (111) crystal plane, but the principle of operation is the same as shown in FIGS. 8a and 8b, wherein throughout the interface between source region and the gate electrode, the BTBT current flows in the on-state is in a direction that is transverse to the gate electrode, as depicted by the arrows in FIGS. 8c and 8d. Alternatively, in FIGS. 8c and 8d, the direction of BTBT current flow is in the <111> direction. For materials which possess effective mass anisotropy, the effective carrier tunneling mass may be lower in the <111> direction than in any other crystal plane direction, such as the <100> direction. Using the sigma shape as described in FIGS. 8c and 8d should result in an increase in BTBT current compared to the structures in FIGS. 8a and 8b.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of manufacturing a tunnel field effect transistor (TFET), comprising:
   depositing a source layer of a source material on top of a substrate layer of a substrate material, wherein the source material is a semi-conducting material having a first conductivity type, and wherein the substrate material is a semi-conducting material having the first conductivity type;
   forming a dummy gate stack, comprising a silicon material, on top of the source material;
   forming sidewall spacers on sidewalls of the dummy gate stack by depositing and etching a sidewall material on top of the source layer, in contact with the sidewalls of the dummy gate stack, wherein the sidewall spacers comprise a drain-side spacer and a source-side spacer;
   forming, on top of the substrate layer, a drain region, wherein the drain region comprises a drain material having a second conductivity type, wherein the drain region replaces an equivalent region of the source layer beneath the drain-side spacer and a portion of the dummy gate stack adjacent to the drain-side spacer, and wherein a source region comprises the region of the source layer remaining after forming the drain region;
   removing the dummy gate stack thereby exposing a top surface, between the source-side spacer and the drain-side spacer, of the source region and the drain region;
   forming a self-aligned cavity by etching through the exposed top surface of the source and the drain regions and etching, further, into the substrate layer to a depth below a bottom of both of a remaining portion of the source region after the etching and a remaining portion of the drain region after the etching; and
   forming a gate stack in the self-aligned cavity, wherein a first portion of the gate stack is interposed between the remaining portion of the source region and the remaining portion of the drain region, and wherein a second portion of the gate stack extends, further, into the self-aligned cavity to the depth below the bottom of both the remaining portion of the source region and the remaining portion of the drain region.

2. The method of claim 1 further comprising:
   forming the TFET with predominantly transverse or longitudinal tunneling.

3. The method of claim 1, wherein depositing the source layer on top of the substrate layer comprises epitaxially growing the source layer on the top of the substrate layer.

4. The method of claim 1 wherein the source material comprises silicon germanium.

5. The method of claim 1, wherein the source material is a P+ material and the drain material is an N+ material.

6. The method of claim 1, wherein the drain region is an N+ material and wherein forming the drain region comprises:
   selectively etching away the equivalent region of the source layer; and
   filling in the equivalent region of the source layer with in-situ doped N+ epitaxial material.

7. The method of claim 1, wherein the self-aligned cavity comprises an anisotropic geometry between the remaining portion of the source region and the remaining portion of the drain region and extending into the substrate layer.

8. The method of claim 1 wherein forming the drain region comprises:
   removing the equivalent region of the source layer on top of the substrate layer and beneath the drain-side spacer and a region of the dummy gate stack adjacent to the drain-side spacer; and
   forming the drain region in the removed portion of the source layer.

* * * * *